(12) United States Patent
Lam et al.

(10) Patent No.: US 7,944,740 B2
(45) Date of Patent: May 17, 2011

(54) MULTI-LEVEL CELL PROGRAMMING OF PCM BY VARYING THE RESET AMPLITUDE

(75) Inventors: Chung H. Lam, Peekskill, NY (US);
Ming-Hsiu Lee, Hsinchu (TW);
Thomas Nirschi, Putzbrunn (DE); Bipin Rajendran, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 12/564,904

(22) Filed: Sep. 22, 2009

(65) Prior Publication Data

US 2011/0069538 A1 Mar. 24, 2011

(51) Int. Cl.
*G11C 11/00* (2006.01)
(52) U.S. Cl. ........................................ 365/163; 365/148
(58) Field of Classification Search .................... 365/113
See application file for complete search history.

(56) References Cited

U.S. PATENT DOCUMENTS

| | | | | |
|---|---|---|---|---|
| 6,687,153 B2* | 2/2004 | Lowrey | ........................... | 365/163 |
| 7,099,180 B1* | 8/2006 | Dodge et al. | ................... | 365/148 |
| 7,365,355 B2 | 4/2008 | Parkinson | ......................... | 257/3 |
| 7,433,226 B2* | 10/2008 | Lung | ............................... | 365/158 |
| 7,787,291 B2* | 8/2010 | Resta et al. | ..................... | 365/163 |
| 2007/0279962 A1 | 12/2007 | Nirschl et al. | ................ | 365/148 |
| 2007/0280023 A1 | 12/2007 | Happ et al. | ..................... | 365/222 |
| 2008/0019170 A1 | 1/2008 | Happ et al. | ..................... | 365/163 |
| 2008/0019257 A1 | 1/2008 | Philipp et al. | ................. | 369/163 |

* cited by examiner

*Primary Examiner* — Tan T. Nguyen
(74) *Attorney, Agent, or Firm* — Ido Tuchman; Vazken Alexanian

(57) ABSTRACT

A phase change memory device and a method for programming the same. The method includes determining a characterized lowest SET current and corresponding SET resistance for the phase change memory device. The method includes determining a characterized RESET current slope for the phase change memory device. The method also includes calculating a first current amplitude for a RESET pulse based on the characterized lowest SET current and the characterized RESET current slope. The method includes applying the RESET pulse to a target memory cell in the phase change memory device and measuring the resistance of the target memory cell. If the measured resistance is substantially less than a target resistance, the method further includes applying one or more additional RESET pulses. In one embodiment of the invention, the one or more additional RESET pulses have current amplitudes greater than a previously applied RESET pulse.

18 Claims, 4 Drawing Sheets

MULTI-LEVEL CELL PROGRAMMING OF PCM BY VARYING THE RESET AMPLITUDE

PARTIES TO A JOINT RESEARCH AGREEMENT

The present invention is a result of activities undertaken within the scope of a joint research agreement between International Business Machines Corporation, a New York corporation, Macronix International Co., Ltd., a corporation of Taiwan, and Qimonda North America Corp., a Delaware corporation.

BACKGROUND OF THE INVENTION

1. Field of the Invention

The present invention relates to phase change memory and more specifically to the programming of a phase change memory device.

2. Description of Background

There are two major groups of computer memory: volatile memory and non-volatile memory. In volatile memory, constant energy input is required to retain information, while in non-volatile memory constant energy input is not required. Examples of volatile memory devices include Dynamic Random Access Memory (DRAM) and Static Random Access Memory (SRAM). DRAM requires the memory element to be constantly refreshed (requiring energy) while SRAM requires a constant supply of energy to maintain the state of the memory element. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM).

As stated, the information in the memory elements of non-volatile memory can be retained for days to decades without power consumption. The present invention is directed to phase change memory; a type of non-volatile memory. In phase change memory information is stored in materials that can be manipulated into different phases. Each of these phases exhibit distinct electrical properties that can be used for storing information. An amorphous and a crystalline phase are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common elements in the group used to produce a chalcogenide semiconductor when creating a phase change memory cell. An example of this would be Ge2Sb2Te5 (GST), SbTe, and In2Se3.

Altering the phase change material's state requires heating the material to a melting point and then cooling the material to one of the possible states. A current passing through the phase change material induces ohmic heating and causes the phase change material to melt. Melting and gradually cooling down the phase change material allows time for the phase change material to form the crystalline state. Melting and abruptly cooling the phase change material quenches the phase change material into the amorphous state.

In multi-bit storage, an individual phase change memory cell must be able to be programmed to multiple states. These multiple states are various ratios of amorphous phased and crystalline phased phase change material. The ratio of amorphous to crystalline phase change material directly affects the electrical resistance of the memory cell.

A problem in phase change memory is accurately programming a phase change memory cell to multiple states. The current necessary to program a memory cell to a specific resistance is dependent on its existing resistant. This poses a problem in accurately programming a phase change memory cell to a target resistance when the current required must be altered according to its existing resistance and target resistance. Thus, it is desirable to devise a method for programming a phase change memory device that can utilize consistent current levels for programming a phase change memory cell to a plurality of target resistances.

SUMMARY OF THE INVENTION

An aspect of the present invention is a method for programming a target memory cell in a phase change memory device to a target resistance. The phase change memory device includes a plurality of memory cells. The target memory cell belongs to the plurality of memory cells. Each memory cell stores binary data represented by at least two resistance states. The method includes setting a phase change element in the target memory cell to a fully amorphous state. The method includes retrieving a characterized lowest SET current for the phase change memory device and corresponding SET resistance. The characterized lowest SET current is the minimum current amplitude of a SET pulse, wherein the SET pulse is the current pulse required to change the phase change element of a memory cell from a fully amorphous state to a fully crystalline state. The method includes retrieving a characterized RESET current slope for the phase change memory device. The characterized RESET current slope is comprised of relative current amplitude values of a RESET pulse necessary for programming the plurality of memory cells to target resistances. The method includes calculating a first current amplitude for a RESET pulse based on the characterized lowest SET current and the characterized RESET current slope. The method includes applying the RESET pulse to the target memory cell in the fully amorphous state. The method also includes measuring the resistance of the target memory cell after the RESET pulse is applied. If the measured resistance of the target memory cell is substantially less than the target resistance the method also includes applying one or more additional RESET pulses to the target memory cell until the measured resistance is substantially equal to the target resistance.

Another aspect of the invention is a phase change memory device. The phase change memory device includes a plurality of memory cells. Each memory cell stores binary data represented by at least two resistance states. The phase change memory device includes a target memory cell. The target memory cell belongs to the plurality of memory cells. The phase change memory device also includes a write unit. The write unit is configured to set a phase change element in the target memory cell to a fully amorphous state. The write unit is configured to retrieve a characterized lowest SET current for the phase change memory device and corresponding SET resistance. The characterized lowest SET current is the minimum current amplitude of a SET pulse, wherein the SET pulse is the current pulse required to change the phase change element of a memory cell from a fully amorphous state to a fully crystalline state. The write unit is configured to retrieve a characterized RESET current slope for the phase change memory device. The characterized RESET current slope is comprised of relative current amplitude values of the RESET pulse necessary for programming the plurality of memory cells to target resistances. The write unit is configured to calculate a first current amplitude for a RESET pulse based on a characterized lowest SET current and a characterized RESET current slope for the phase change memory device. The write unit is configured to apply the RESET pulse to the target memory cell in the fully amorphous state. The write unit is also configured to measure the resistance of the target memory cell after the RESET pulse is applied. If the measured resistance of the target memory cell is substantially less than the target resistance, the write unit is further configured to apply one or more additional RESET pulses to the target memory cell until the measured resistance is substantially equal to the target resistance.

Yet another aspect of the invention is a computer program product embodied in a computer usable memory. The computer program product is comprised of computer readable program codes coupled to the computer usable memory for programming a target memory cell in a phase change memory device to a target resistance. The phase change memory device includes a plurality of memory cells, with the target memory cell belonging to the plurality of memory cells. Each memory cell stores binary data represented by at least two resistance states. The computer readable program codes are configured to cause the program to set a phase change element in the target memory cell to a fully amorphous state. The computer readable program codes are configured to cause the program to retrieve a characterized lowest SET current for the phase change memory device and corresponding SET resistance. The characterized lowest SET current is the minimum current amplitude of a SET pulse, wherein the SET pulse is the current pulse required to change the phase change element of a memory cell from a fully amorphous state to a fully crystalline state. The computer readable program codes are configured to cause the program to retrieve a characterized RESET current slope for the phase change memory device. The characterized RESET current slope is comprised of relative current amplitude values of the RESET pulse necessary for programming the plurality of memory cells to target resistances. The computer readable program codes are configured to cause the program to calculate a first current amplitude for a RESET pulse based on a characterized lowest SET current and a characterized RESET current slope for the phase change memory device. The computer readable program codes are configured to cause the program to apply the RESET pulse to the target memory cell in the fully amorphous state. The computer readable program codes are also configured to cause the program to measure the resistance of the target memory cell after the RESET pulse is applied. If the measured resistance of the target memory cell is substantially less than the target resistance, the computer readable program codes are also configured to cause the program to apply one or more additional RESET pulses to the target memory cell until the measured resistance is substantially equal to the target resistance.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-4.

As described below, an aspect of the present invention is a method for programming a phase change memory device.

Figure 1:
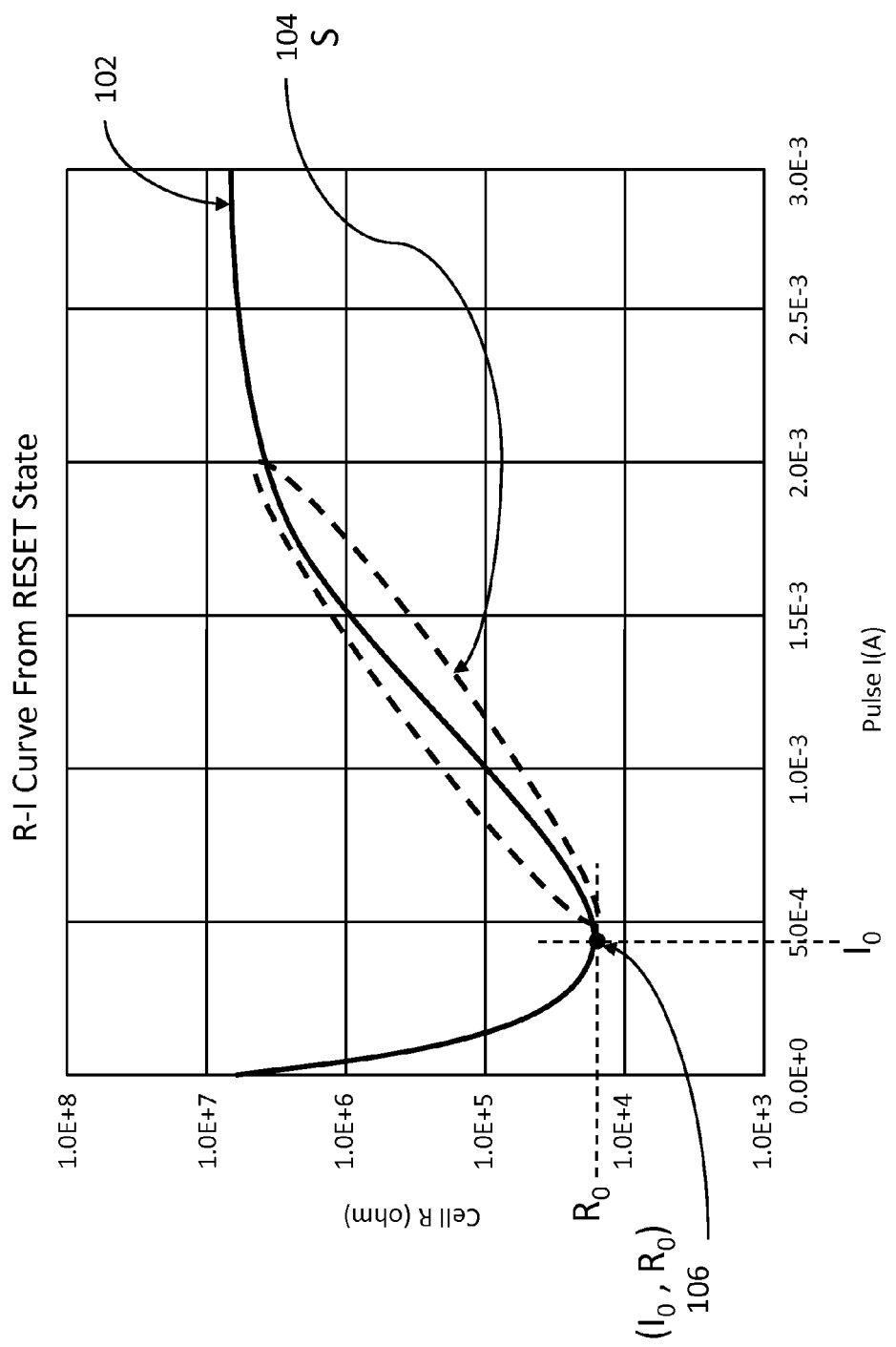
FIG. 1 illustrates a current vs. resistance curve from a starting RESET state.

FIG. 1 illustrates a graph depicting a current vs. resistance curve 102 of a memory cell. Current pulses (generally with a 4 nanosecond power on, a 400 nanosecond pulse, and a 4 nanosecond trailing edge) of varying amplitude are applied to a phase change element of the memory cell and corresponding electrical resistances are measured. In this particular embodiment of the invention, the current pulses are applied to the phase change element programmed to a fully amorphous state, also known as the RESET state. Note, the values of the graph are illustrative and do not necessarily reflect actual measured values for a specific phase change material.

As current pulses of increasing amplitude are applied, the resistance of the phase change element falls quickly (relative to the rest of the curve 102) and reaches a minimum when it becomes fully crystalline (point 106, corresponding to lowest SET current and the corresponding SET resistance $R_0$), also known as the SET state. After the resistance has reached the minimum, 106, a snapback occurs. As current pulses of increasing amplitude are applied from $I_0$, the resistance increases gradually (relative to the curve 102) until it has reached its maximum resistance in the fully amorphous state (RESET state). The curve 102 from $I_0$ to the fully amorphous state is a characterized RESET current slope, S 104. This RESET current slope 104 is a characterization of intermediate states of the phase change element. These intermediate states are composed of various ratios of crystalline to amorphous phase change material. Higher current pulse amplitudes equate to higher melt volumes (amorphous volume prior to cooling down). So the greater the amplitude of the current pulse applied to the memory cell, the greater the measured resistance. Those skilled in the art will appreciate that utilizing the current pulse amplitudes corresponding to the characterized RESET current slope 104 (the currents that are necessary to change the phase change material from the fully crystalline state to more amorphous states) instead of the current pulse amplitudes corresponding to SET the phase change material (the currents that are necessary to change the phase change material from the fully amorphous state to more crystalline states) beneficially allows greater control of resistance values due to its gradual slope.

In a sample of memory cells from a phase change memory device, a variation will occur in the curves 102. In this sample of memory cells, the minimum current required for a SET pulse (the current pulse utilized for changing the phase change element in a particular memory cell from the amorphous phase to the crystalline phase) in at least one memory cell is called the characterized lowest SET pulse. In other words, the $I_0$ with the lowest corresponding current in a sample of memory cells is the characterized lowest SET pulse. Beneficially, the characterized RESET current slopes 104 for the sample of memory cells (with varying $I_0$) are similar in degree.

Figure 2:
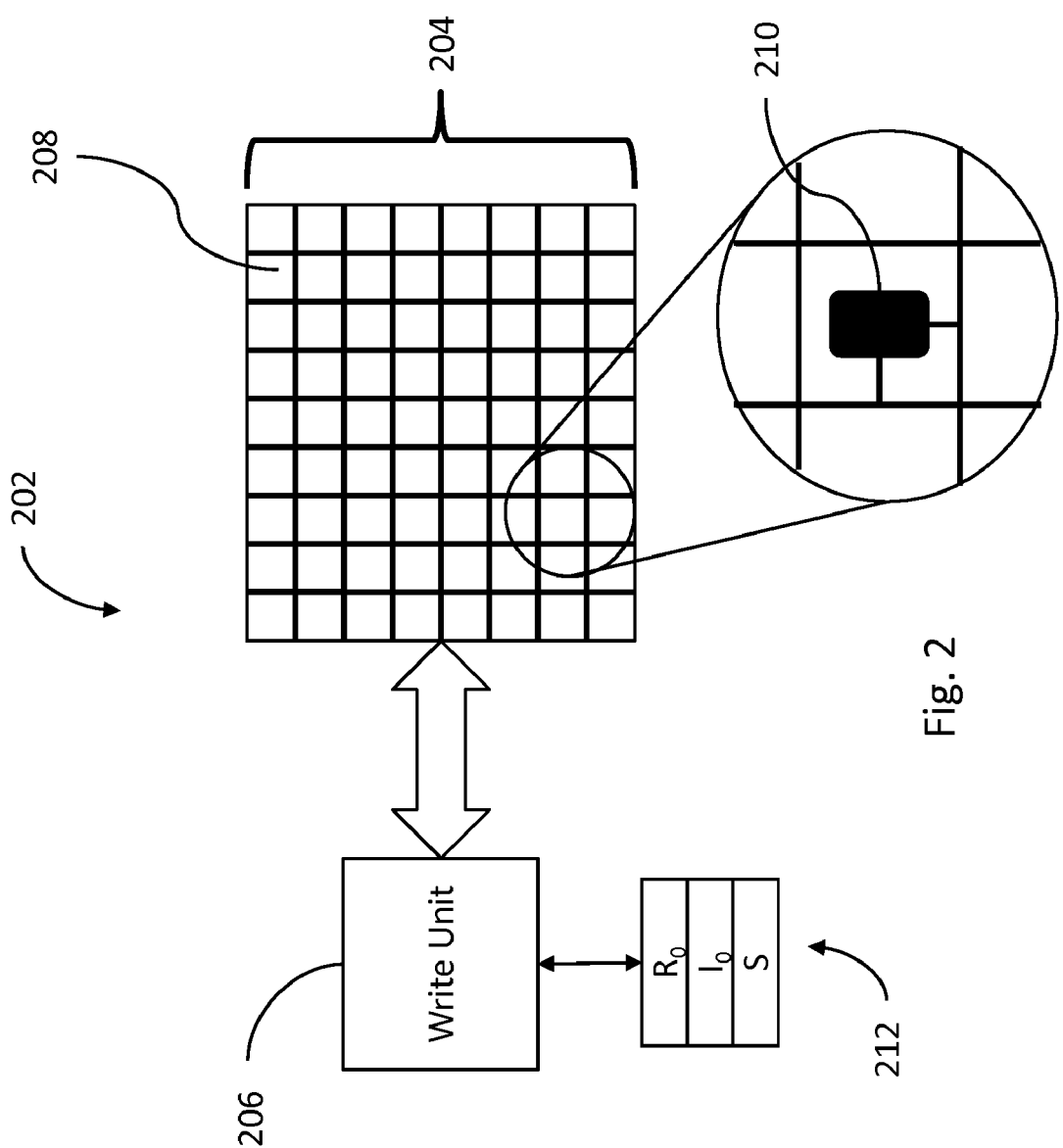
FIG. 2 illustrates a phase change memory device.

Turning to FIG. 2, an embodiment of a phase change memory device 202 in accordance with the present invention is shown. The phase change memory device 202 includes a plurality of memory cells 204 and a write unit 206. Each individual memory cell 208 includes a phase change element 210 that stores binary data represented by at least two resistance states. The phase change element 210 is comprised of phase change material. Those skilled in the art will recognize that a variety of phase change materials may be utilized, such as, but not limited to Germanium-Antimony-Tellurium (GST).

During write operations, the write unit 206 is configured to program the phase change element 210 in a target memory cell 208 to a fully amorphous state. The write unit 206 is also configured to determine the characterized lowest SET current and the characterized RESET current slope for the phase change memory device 202 (described further below). The write unit 206 is further configured to calculate a first current amplitude for the target memory cell 208 for a target resistance. The first current amplitude is the corresponding current amplitude determined to program the memory cell to the target resistance based on the characterized RESET current slope applied to the characterized lowest SET current. Specifically, the first current amplitude is calculated using the expression $I_1 = I_0 + (1/S) * \log_{10}[R_t/R_0]$, where $R_t$ is the target resistance of the memory cell.

In a particular embodiment of the invention, the write unit 206 accesses memory 212 storing values for $I_0$, $R_0$ and S. With these three values, the first current amplitude can be calculated as set forth above. Preferably, the memory is non-volatile memory. In one embodiment of the invention, part of the plurality of memory cells 204 are dedicated to storing values for $I_0$, $R_0$ and S.

The write unit 206 is also configured to apply a RESET pulse with the first current amplitude to the target memory cell 208 (in the fully amorphous state). The resistance of the target memory cell 208 is measured after the RESET pulse is applied. If the measured resistance of the target memory cell 208 is substantially less than the target resistance, the write unit 206 is further configured to apply one or more additional RESET pulses to the target memory cell until the measured resistance is substantially equal to the target resistance.

In one particular embodiment of the invention, when the measured resistance of the target memory cell 208 is substantially less than the target resistance, the write unit 206 is configured to set the phase change element in the target memory cell back to the fully amorphous state. In this particular embodiment, this additional process provides consistency for the proceeding RESET pulses with respect to the characterized data obtained above.

When the measured resistance is not substantially equal to the target resistance, but lesser than the target resistance, a second current amplitude is calculated for the RESET pulse. Since the first current amplitude was calculated from the characterized lowest SET current the second current amplitude for the RESET pulse is calculated to be greater than the first current amplitude for the RESET pulse (additional applied current amplitudes for the RESET pulse are also greater than previously applied current amplitudes for the RESET pulse). Specifically, if the magnitude of the $n^{th}$ attempt at programming was In, and the measured resistance was Rn, after that attempt, the programming current for the $(n+1)^{th}$ attempt is given by the relation $I_{n+1} = I_n + (1/S) * \log_{10}[R_t/Rn]$. The RESET pulse with the second current amplitude is applied to the target memory cell 208 and the resistance is measured again. If the measured resistance is substantially less than the target resistance, the process of applying additional RESET pulses is repeated until the measured resistance is substantially equal to the target resistance. In an alternate embodiment of the invention, the phase change element of the target memory cell is not set back to the fully amorphous phase prior to calculating the second current amplitude.

Figure 3:
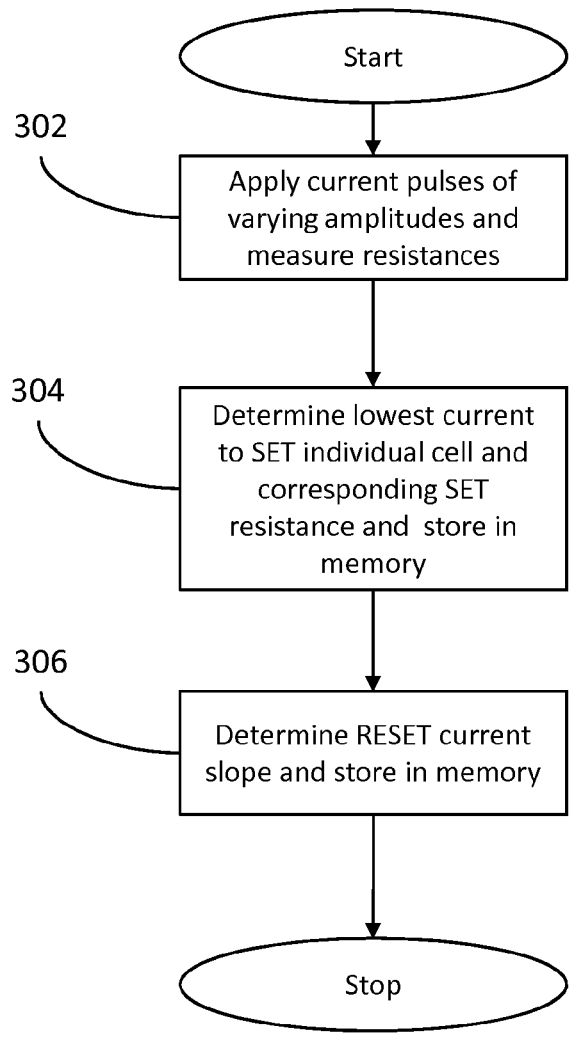
FIG. 3 illustrates a flowchart for a method for determining a lowest SET current and a RESET current slope.

In FIG. 3, a flowchart illustrating one embodiment of a method for determining the characterized lowest SET current corresponding SET resistance $R_0$, and the characterized RESET current slope S in accordance with the present invention. In embodiment, the operations performed in determining $I_0$, $R_0$, and S are preformed only once during device characterization. Other embodiments may perform these steps a particular time intervals, or every time the device is powered up.

The process flow begins at applying operation 302. During applying operation 302 current pulses of various amplitudes are applied to the phase change element of each memory cell in a sample of memory cells in the phase change memory device. The electrical resistance of the phase change element of each memory cell in the sample of memory cells is measured for each current pulse applied. After applying operation 302 is performed, control passes to determining operation 304.

During determining operation 304, the measured resistances and their corresponding current pulses are compared. Since the measured lowest resistances (when the memory cells are in the fully crystalline phase) should be reasonably equal, the lowest current pulse corresponding to the fully crystalline phase is determined to be the characterized lowest SET current (as stated above, the lowest $I_0$) for the phase change memory device. The corresponding SET resistance $R_0$ is also determined by measuring the cell resistance.

Determining operation 304 may further include storing the lowest SET current $I_0$ and corresponding SET resistance $R_0$ values in memory. The memory may be volatile or non-volatile memory. In one embodiment of the invention, a plurality of memory cell in the memory array is reserved for storing $I_0$ and $R_0$ values. After determining operation 304 is completed, control passes to determining operation 306.

During determining operation 306, the characterized RESET current slope is determined from the characterized lowest SET current to the fully amorphous phase from the data obtained by apply operation 302. For example, measurements are taken at various points along the current-resistance curve of memory cells in the memory device. The resistance at each amplitude is measured and the characterized RESET current slope is determined using a best-fit line through the measured data points.

Determining operation 306 may further include storing the characterized RESET current slope S value in memory. Again, the memory may be volatile or non-volatile memory. In one embodiment of the invention, a plurality of memory cell in the memory array is reserved for storing the characterized RESET current slope S value. After determining operation 306 is completed the method ends.

Figure 4:
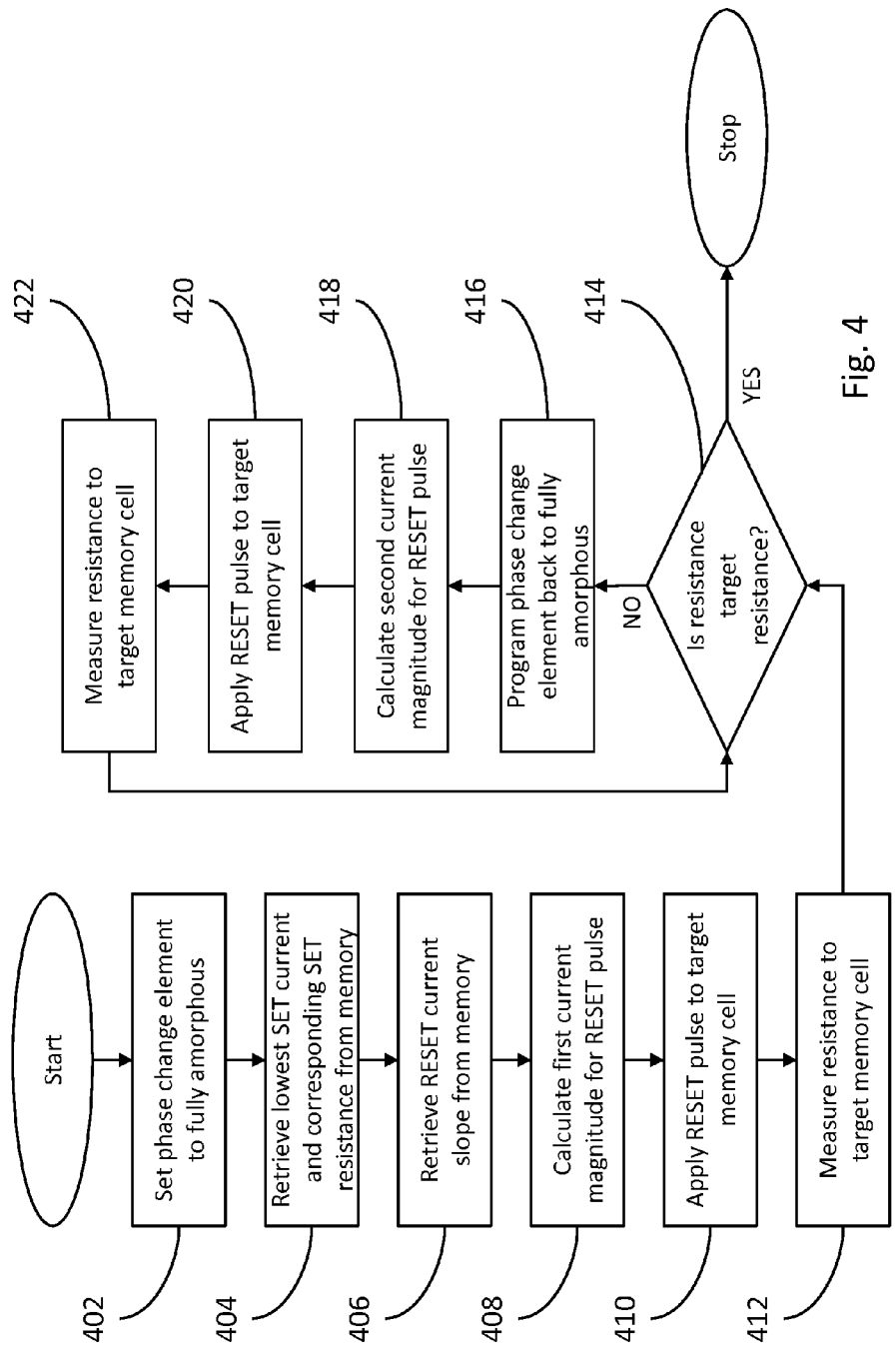
FIG. 4 illustrates a flowchart for a method for programming a phase change memory device.

FIG. 4 illustrates one particular embodiment of the invention for programming the phase change memory device. The operations depicted in FIG. 4 can be implemented in software, firmware, hardware or some combination thereof. Program code logic may be stored in a storage medium, loaded into and/or executed by a computer, wherein, when the program code logic is loaded into and executed by a computer, the computer becomes an apparatus for practicing the invention. Examples of storage medium include solid state memory (RAM or ROM), floppy diskettes, CD-ROMs, hard drives, universal serial bus (USB) flash drives, or any other computer-readable storage medium.

Process flow begins at setting operation 402. During setting operation 402, the phase change element in a target memory cell in the phase change memory device is set to the fully amorphous state. After setting operation 402 has been performed, control passes to retrieving operation 404.

During retrieving operation 404, the characterized lowest SET current $I_0$ and corresponding SET resistance $R_0$ values for the phase change memory device is are retrieved from memory (see determining operation 304 in FIG. 3). After retrieving operation 404 is performed, control passes to retrieving operation 406.

During retrieving operation 406, the characterized RESET current slope S for the phase change memory device is retrieved from memory (see determining operation 306 in FIG. 3). After determining operation 406 is performed, control passes to calculating operation 408.

During calculating operation 408, the first current amplitude for the RESET pulse is calculated. The first current amplitude, as stated above, is calculated from determining the target resistance and choosing the corresponding current amplitude from the characterized lowest SET current and the characterized RESET current slope. For example, the current amplitude ($I_x$) can be calculated as $I_1=I_0+(1/S)*\log_{10}[R_t/R_0]$ where $R_t$ is the target resistance, S is the characterized RESET current slope, and $I_0$ is the characterized lowest SET current and $R_0$ the corresponding lowest SET resistance. After calculating operation 408 is completed, control passes to applying operation 410.

During applying operation 410, the RESET pulse with the first current amplitude is applied to the target memory cell. After applying operation 410 is completed, control passes to measuring operation 412.

During measuring operation 412, the electrical resistance of the target memory cell is measured. After measuring operation 412 is performed, control passes to determining operation 414.

During determining operation 414, a determination as to whether or not the measured resistance is substantially equal to the target resistance or substantially less than the target resistance is made. If the measured resistance is substantially equal to the target resistance then the process operations end. If the measured resistance is substantially less than the target resistance then the process control passes to programming operation 416. However, in an alternate embodiment of the invention, programming operation 416 is bypassed and after determining operation 414, control passes to calculating operation 418.

During setting operation 416, the phase change element in the target memory cell is set back to the fully amorphous phase. After programming operation 416 is completed, control passes to calculating operation 418.

During calculating operation 418, the second current amplitude for the RESET pulse is calculated. Since the first current amplitude was calculated from the characterized lowest SET current, the second current amplitude is calculated to be greater than the first current amplitude. In one embodiment, a constant incremental amount is added to the previously applied current amplitude. In another embodiment, if the magnitude of the $n^{th}$ attempt at programming was In, and the measured resistance was Rn, after that attempt, the programming current for the $(n+1)^{th}$ attempt is given by the relation $I_{n+1}=I_n+(1/S)*\log_{10}[R_t/Rn]$. In yet another embodiment, if the magnitude of the $n^{th}$ attempt at programming was In, and the measured resistance was Rn, after that attempt, the programming current for the $(n+1)^{th}$ attempt is given by the relation $I_{n+1}=I_n+(1/2S)*\log_{10}[R_t/Rn]$. After calculating operation 418 is performed, control passes to applying operation 420.

During applying operation 420, the RESET pulse with the second current amplitude is applied to the target memory cell. After applying operation 420 is completed, control passes to measuring operation 422.

During measuring operation 422, the electrical resistance of the target memory cell is measured. After measuring operation 422 is performed, control passes to determining operation 414. Determining operation 414 is performed again and if the measured resistance is substantially less than the target resistance then the process control passes to set operation 416 or calculate operation 418 (depending on the embodiment) again and the process from set operation 416 or calculate operation 418 to measure operation 422 is repeated until the measured resistance is substantially equal to the target resistance.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Having described preferred embodiments for the method for programming a phase change memory device (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for programming a target memory cell in a phase change memory device to a target resistance, the phase change memory device including a plurality of memory cells, each memory cell storing binary data represented by at least two resistance states, the target memory cell belonging to the plurality of memory cells, the method comprising:

retrieving a characterized lowest SET current and a corresponding SET resistance for the phase change memory device, the characterized lowest SET current being a minimum current amplitude of a SET pulse, the SET pulse being a current pulse required to change a phase change element of at least one memory cell in the phase change memory device from a fully amorphous state to a fully crystalline state which is the corresponding SET resistance;

retrieving a characterized RESET current slope for the phase change memory device, the characterized RESET current slope comprising relative current amplitude values of a RESET pulse necessary for programming the plurality of memory cells to target resistances;

calculating a first current amplitude for a RESET pulse based on the characterized lowest SET current, the corresponding SET resistance and the characterized RESET current slope for the phase change memory device;

applying the RESET pulse to the target memory cell;

measuring the resistance of the target memory cell after the RESET pulse is applied; and if the measured resistance of the target memory cell is substantially less than the target resistance, applying one or more additional RESET pulses to the target memory cell until the measured resistance is substantially equal to the target resistance.

2. The method of claim 1, wherein applying the one or more additional RESET pulses to the target memory cell comprises:

calculating a second current amplitude for the RESET pulse, the second current amplitude being greater than a previously applied current amplitude; and repeating the operation to apply the RESET pulse and the operation to measure the resistance until the measured resistance is substantially equal to the target resistance.

3. The method of claim 2, further comprising setting the phase change element in the target memory cell to the fully amorphous state before applying at least one of the RESET pulses.

4. The method of claim 1, further comprising:

applying current pulses of varying amplitudes to a sample of memory cells in the phase change memory device; and determining the characterized lowest SET current necessary to set an individual memory cell to a fully crystalline state and the corresponding SET resistance; and storing, in memory, values representing the characterized lowest SET current and the corresponding SET resistance.

5. The method of claim 4, further comprising:
   determining the characterized RESET current slope by measuring the resistances of the sample of memory cells with respect to RESET pulse currents of varying amplitudes applied to the sample memory cells; and
   storing, in memory, a value representing the characterized RESET current slope.

6. The method of claim 1, further comprising programming a phase change element in the target memory cell to the fully amorphous state or a partially amorphous state before applying the RESET pulse to the target memory cell.

7. A phase change memory device comprising:
   a plurality of memory cells, each memory cell storing binary data represented by at least two resistance states;
   a target memory cell, the target memory cell belonging to the plurality of memory cells and including a phase change element; and
   a write unit configured to:
   retrieve a characterized lowest SET current and a corresponding SET resistance for the phase change memory device, the characterized lowest SET current being a minimum current amplitude of a SET pulse, the SET pulse being a current pulse required to change the phase change element of at least one memory cell in the phase change memory device from a fully amorphous state to a fully crystalline state;
   retrieve a characterized RESET current slope for the phase change memory device, the characterized RESET current slope comprising relative current amplitude values of the RESET pulse necessary for programming the plurality of memory cells to target resistances;
   calculate a first current amplitude for a RESET pulse based on the characterized lowest SET current, the corresponding SET resistance and the characterized RESET current slope for the phase change memory device;
   apply the RESET pulse to the target memory cell;
   measure the resistance of the target memory cell after the RESET pulse is applied; and
   if the measured resistance of the target memory cell is substantially less than the target resistance, apply one or more additional RESET pulses to the target memory cell until the measured resistance is substantially equal to the target resistance.

8. The phase change memory device of claim 7, wherein the write unit, when applying the one or more additional RESET pulses to the target memory cell, is further configured to:
   calculate a second current amplitude for the RESET pulse, the second current amplitude being greater than a previously applied current amplitude; and
   repeat the apply the RESET pulse operation and the measure the resistance operation until the measured resistance is substantially equal to the target resistance.

9. The phase change memory device of claim 8, wherein the write unit is further configured to set the phase change element in the target memory cell to the fully amorphous state before applying at least one of the RESET pulses.

10. The phase change memory device of claim 7, wherein the write unit is further configured to:
    apply current pulses of varying amplitudes to a sample of memory cells in the phase change memory device;
    determine the characterized lowest SET current necessary to set an individual memory cell to a fully crystalline state and the corresponding SET resistance; and
    store, in memory, values representing the characterized lowest SET current and the corresponding SET resistance.

11. The phase change memory device of claim 10, wherein the write unit is further configured to:
    determine the characterized RESET current slope by measuring the resistances of the sample of memory cells with respect to RESET pulse currents of varying amplitudes applied to the sample memory cells; and
    store, in memory, a value representing the characterized RESET current slope.

12. The phase change memory device of claim 10, wherein the write unit is further configured to program the phase change element in the target memory cell to the fully amorphous state or a partially amorphous state before applying the RESET pulse to the target memory cell.

13. A computer program product embodied in a computer usable memory comprising:
    computer readable program codes coupled to the computer usable memory for programming a target memory cell in a phase change memory device to a target resistance, the phase change memory device including a plurality of memory cells, each memory cell storing binary data represented by at least two resistance states, the target memory cell belonging to the plurality of memory cells and includes a phase change element, the computer readable program codes configured to cause the program to:
    retrieve a characterized lowest SET current and a corresponding SET resistance for the phase change memory device, the characterized lowest SET current being a minimum current amplitude of a SET pulse, the SET pulse being a current pulse required to change the phase change element of at least one memory cell in the phase change memory device from a fully amorphous state to a fully crystalline state;
    retrieve a characterized RESET current slope for the phase change memory device, the characterized RESET current slope comprising relative current amplitude values of the RESET pulse necessary for programming the plurality of memory cells to target resistances;
    calculate a first current amplitude for a RESET pulse based on the characterized lowest SET current, the corresponding SET resistance and the characterized RESET current slope for the phase change memory device;
    apply the RESET pulse to the target memory cell;
    measure the resistance of the target memory cell after the RESET pulse is applied; and
    if the measured resistance of the target memory cell is substantially less than the target resistance, apply one or more additional RESET pulses to the target memory cell until the measured resistance is substantially equal to the target resistance.

14. The computer program product of claim 13, wherein the computer readable program codes to apply the one or more additional RESET pulses to the target memory cell comprises computer readable program codes to:
    calculate a second current amplitude for the RESET pulse, the second current amplitude being greater than a previously applied current amplitude; and
    repeat the apply the RESET pulse operation and the measure the resistance operation until the measured resistance is substantially equal to the target resistance.

15. The computer program product of claim 14, further comprising computer readable program codes to set the phase change element in the target memory cell to the fully amorphous state before applying at least one of the RESET pulses.

16. The computer program product of claim 13, further comprising computer readable program codes to:
    apply current pulses of varying amplitudes to a sample of memory cells in the phase change memory device;

determine characterized lowest SET current necessary to set an individual memory cell to a fully crystalline state and the corresponding SET resistance; and store, in memory, values representing the characterized lowest SET current and the corresponding SET resistance.

17. The computer program product of claim 13, further comprising computer readable program codes to:

determine the characterized RESET current slope by measuring the resistances of a sample of memory cells with respect to RESET pulse currents of varying amplitudes applied to the sample memory cells; and store, in memory, a value representing the characterized RESET current slope.

18. The computer program product of claim 13, further comprising computer readable program codes to program the phase change element in the target memory cell to the fully amorphous state or a partially amorphous state before applying the RESET pulse to the target memory cell.

* * * * *